(12) United States Patent
Sampei

(10) Patent No.: US 11,804,802 B2
(45) Date of Patent: Oct. 31, 2023

(54) SEMICONDUCTOR INTEGRATED CIRCUIT, TRANSMISSION CIRCUIT, AND CALIBRATION METHOD

(71) Applicant: Kioxia Corporation, Tokyo (JP)

(72) Inventor: Yoshitaka Sampei, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/807,510

(22) Filed: Jun. 17, 2022

(65) Prior Publication Data

US 2023/0308051 A1   Sep. 28, 2023

(30) Foreign Application Priority Data

Mar. 22, 2022 (JP) .................... 2022-045906

(51) Int. Cl.
| | |
|---|---|
| *H03B 5/04* | (2006.01) |
| *H03L 7/099* | (2006.01) |
| *H03L 7/093* | (2006.01) |
| *H03L 7/089* | (2006.01) |

(52) U.S. Cl.
CPC ............. *H03B 5/04* (2013.01); *H03L 7/0891* (2013.01); *H03L 7/093* (2013.01); *H03L 7/099* (2013.01); *H03B 2200/004* (2013.01); *H03B 2200/0062* (2013.01)

(58) Field of Classification Search
CPC ...................................................... H03B 5/04
USPC ........................................................ 331/40
See application file for complete search history.

(56) References Cited

U.S. PATENT DOCUMENTS

| | | | |
|---|---|---|---|
| 8,134,418 | B2 | 3/2012 | Jiang |
| 10,763,864 | B2* | 9/2020 | Goumballa ............. H03L 7/099 |
| 11,356,058 | B1* | 6/2022 | Huang .................. H03B 5/1243 |
| 2005/0206465 | A1 | 9/2005 | Okamoto |
| 2009/0295492 | A1* | 12/2009 | Finocchiaro ......... H03B 5/1253 |
| | | | 331/117 R |
| 2015/0180486 | A1* | 6/2015 | Shanan ................... H03L 7/099 |
| | | | 327/156 |

FOREIGN PATENT DOCUMENTS

| | | |
|---|---|---|
| JP | 2005-269310 A | 9/2005 |
| JP | 2005-333466 A | 12/2005 |
| JP | 5756168 B2 | 7/2015 |

* cited by examiner

*Primary Examiner* — Joseph Chang
(74) *Attorney, Agent, or Firm* — Oblon, McClelland, Maier & Neustadt, L.L.P.

(57) ABSTRACT

A semiconductor integrated circuit has a first output node and a second output node that complementarily outputs an oscillation signal, a capacitance circuit, an inductor, a first inverter and a second inverter connected in parallel and in opposite directions, a bias circuit that supplies a bias voltage to the capacitance circuit, and a control circuit that controls the bias circuit and supplies a reference voltage for controlling an oscillation frequency of the oscillation signal to the capacitance circuit. The capacitance circuit includes a first variable capacitance element and a second variable capacitance element connected in series, and the control circuit controls the bias voltage based on a change in an oscillation frequency of the oscillation signal when a voltage level of the reference voltage supplied to a connection node of the first variable capacitance element and the second variable capacitance element is changed in a plurality of ways.

20 Claims, 10 Drawing Sheets

SEMICONDUCTOR INTEGRATED CIRCUIT, TRANSMISSION CIRCUIT, AND CALIBRATION METHOD

CROSS REFERENCE TO RELATED APPLICATIONS

This application is based upon and claims the benefit of priority from the prior Japanese Patent Application No. 2022-45906, filed on Mar. 22, 2022, the entire contents of which are incorporated herein by reference.

FIELD

An embodiment of the present disclosure relates to a semiconductor integrated circuit, a transmission circuit, and a calibration method.

BACKGROUND

As one of voltage controlled oscillators, an LC voltage controlled oscillator (LCVCO) is known. The LCVCO has characteristics of excellent low noise performance and small jitter as compared with a general ring-type VCO, and is suitable for transmission of a high-frequency signal.

However, in the conventional LCVCO, the gain may fluctuate in accordance with the voltage level of the control signal for variably controlling the frequency.

DETAILED DESCRIPTION

In order to solve the above problem, according to an embodiment of the present disclosure, there is provided a semiconductor integrated circuit including:

a first output node and a second output node configured to complementarily output an oscillation signal;

a capacitance circuit connected between the first output node and the second output node;

an inductor connected between the first output node and the second output node;

a first inverter and a second inverter connected in parallel and in opposite directions to each other between the first output node and the second output node;

a bias circuit configured to supply a bias voltage to the capacitance circuit; and a control circuit configured to control the bias circuit and to supply a reference voltage for controlling an oscillation frequency of the oscillation signal to the capacitance circuit, wherein the capacitance circuit includes a first variable capacitance element and a second variable capacitance element connected in series between the first output node and the second output node, and the control circuit is configured to control the bias voltage on a basis of a change in an oscillation frequency of the oscillation signal when a voltage level of the reference voltage supplied to a connection node of the first variable capacitance element and the second variable capacitance element is changed in a plurality of ways.

Hereinafter, embodiments of a semiconductor integrated circuit, a transmission circuit, and a calibration method will be described with reference to the drawings. Although main components of the semiconductor integrated circuit, the transmission circuit, and the calibration method will be mainly described below, the semiconductor integrated circuit, the transmission circuit, and the calibration method may include components and functions that are not illustrated or described. The following description does not exclude components and functions not illustrated or described.

Figure 1:
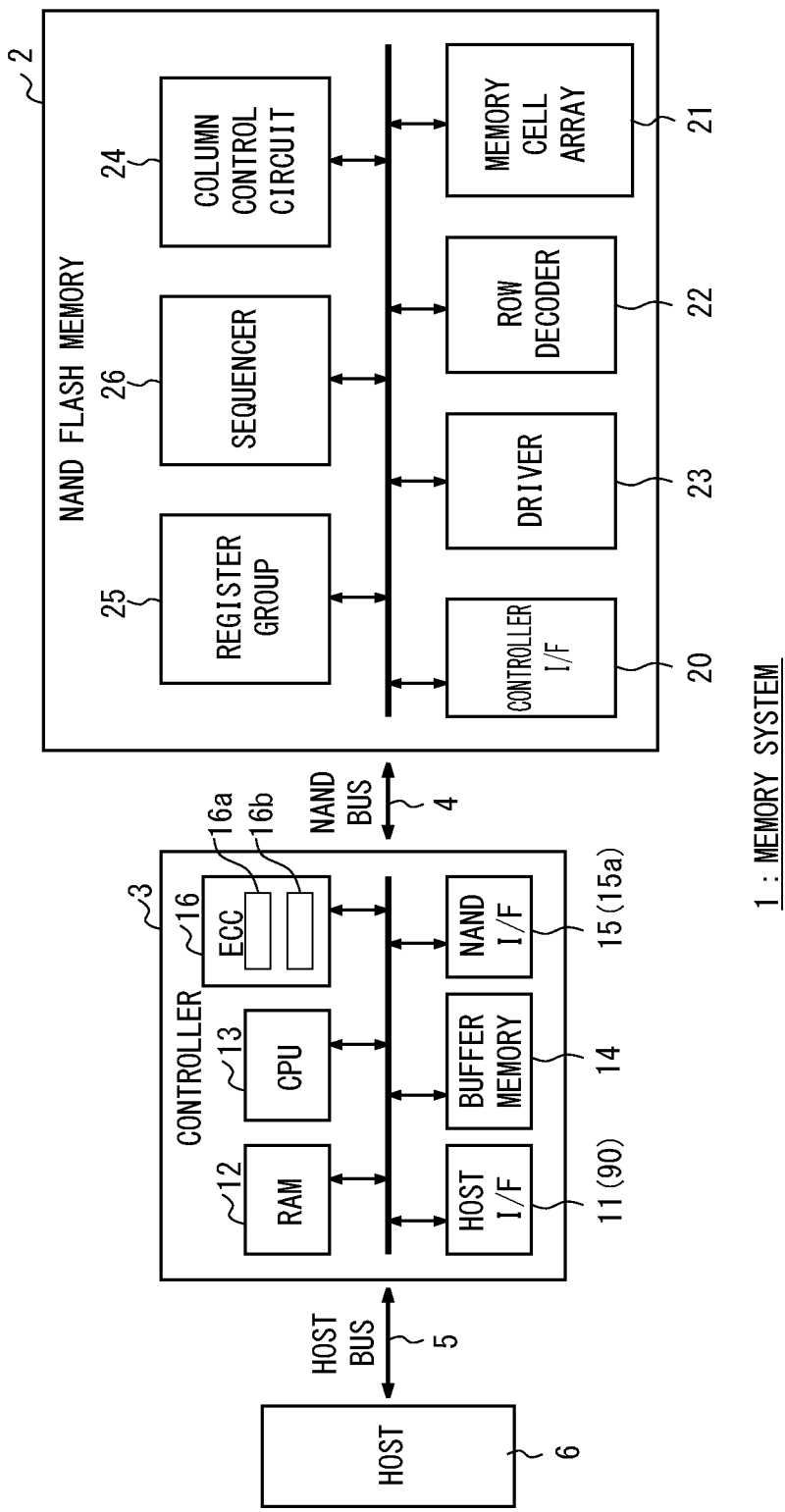
FIG. 1 is a block diagram illustrating a schematic configuration of a memory system according to an embodiment.

FIG. 1 is a block diagram illustrating a schematic configuration of a memory system 1 according to an embodiment. The memory system 1 of FIG. 1 shows a configuration of an SSD using a NAND flash memory (hereinafter, simply referred to as a NAND memory) 2. Note that the memory system 1 of FIG. 1 is also applicable to various systems other than the SSD, for example, a universal flash storage (UFS) device, a multi media card (MMC), an SD card, a universal serial bus (USB) memory, and the like. In addition, the memory system 1 of FIG. 1 is also applicable to a system using a non-volatile memory other than the NAND memory 2 (for example, magnetoresistive random access memory (MRAM), resistive random access memory (ReRAM), phase-change random access memory (PRAM), or the like) or a system using a volatile memory (for example, dynamic random access memory (DRAM), static random access memory (SRAM), or the like).

The memory system 1 of FIG. 1 includes the NAND memory 2 and a controller 3. A specific configuration of the NAND memory 2 will be described later.

The controller 3 is connected to the NAND memory 2 via the NAND bus 4 and controls the NAND memory 2. The controller 3 can be connected to a host apparatus (hereinafter, simply referred to as a host) 6 via a host bus 5. The controller 3 accesses the NAND memory 2 via the NAND bus 4 in response to a command received from the host 6 via the host bus 5. The host 6 is, for example, an electronic device such as a personal computer or a server. The host bus 5 is a bus conforming to an interface standard such as PCIe™, UFS, or Ethernet™. The NAND bus 4 is a bus conforming to an interface standard such as Toggle IF. That is, the controller 3 transmits and receives signals to and from the host 6 and the NAND memory 2 in accordance with a predetermined interface standard.

The controller 3 includes a host interface circuit (host I/F) 11, a built-in memory (RAM) 12, a processor (CPU) 13, a buffer memory 14, a NAND interface circuit (NAND I/F) 15, and an error checking and correcting (ECC) circuit 16. The controller 3 can be configured as a system-on-a-chip (SoC) that seals these configurations in one package.

The host interface circuit 11 is connected to the host 6 via the host bus 5, and transfers a command and data received from the host 6 to the CPU 13 and the buffer memory 14. In response to a command from the CPU 13, the host interface circuit 11 transfers the data stored in the buffer memory 14 to the host 6. The host interface circuit 11 includes a reception circuit 90. The reception circuit 90 receives a command and data from the host 6.

The CPU 13 controls the operations of the controller 3. For example, when receiving a write command from the host 6, the CPU 13 issues a write command to the NAND interface circuit 15 in response to the write command. When reading and erasing, the CPU 13 issues a read command and an erase command to the NAND interface circuit 15 in response to each of the reading and the erasing. In addition, the CPU 13 executes various processing for managing the NAND memory 2. The various processing includes garbage collection, refreshing, and wear leveling. The operations of the controller 3 described below may be realized by the CPU 13 executing firmware or may be realized by hardware.

The NAND interface circuit 15 is connected to the NAND memory 2 via the NAND bus 4 and performs communication with the NAND memory 2. Then, the NAND interface circuit 15 transmits data to be written and a control signal to the NAND memory 2 on the basis of the write command received from the CPU 13. The data to be written is transmitted as data DQ. The control signal includes a strobe signal DQS. In addition, the NAND interface circuit 15 makes a read request to the NAND memory 2 on the basis of the read command received from the CPU 13, and receives data to be read and a control signal from the NAND memory 2. The data to be read is received as data DQ. The control signal includes a strobe signal DQS. The NAND interface circuit 15 includes a transmission and reception circuit 15*a*. The transmission and reception circuit 15*a* receives data to be read and a control signal from the NAND memory 2. The buffer memory 14 temporarily stores data to be written and data to be read. The NAND interface circuit 15 receives the data DQ and the strobe signal DQS transmitted from the NAND memory 2 via the NAND bus 4, samples the data DQ by the strobe signal DQS, and then performs control to temporarily write the data DQ to the buffer memory 14 as data to be read. In accordance with an instruction from the CPU 13, the NAND interface circuit 15 synchronizes the data DQ corresponding to the data to be written with the strobe signal DQS and transmits the data DQ to the NAND memory 2 via the NAND bus 4. The detailed internal configuration and operations of the NAND interface circuit 15 will be described later.

The RAM 12 is, for example, a semiconductor memory such as a DRAM or an SRAM, and is used as a work area of the CPU 13. The RAM 12 stores firmware executed by the CPU 13, various management information for managing the NAND memory 2, and the like. The RAM 12 may be provided outside the controller 3.

The ECC circuit 16 performs processing related to error detection and error correction related to data to be written to and data stored in the NAND memory 2. The ECC circuit 16 includes an encoder 16*a* and a decoder 16*b*. The encoder 16*a* generates an error correction code as data is written and adds the error correction code to the write data. The decoder 16*b* detects an error included in the data read from the NAND memory 2 and corrects the detected error with an error correction code.

Next, a configuration of the NAND memory 2 will be described. As illustrated in FIG. 1, the NAND memory 2 includes a controller interface circuit (controller I/F) 20, a memory cell array 21, a row decoder 22, a driver circuit 23, a column control circuit 24, a register group 25, and a sequencer 26. The controller interface circuit (controller I/F) 20, the row decoder 22, the driver circuit 23, the column control circuit 24, the register group 25, and the sequencer 26 are peripheral circuits of the memory cell array 21.

The controller interface circuit 20 is connected to the controller 3 via the NAND bus 4 and performs communication with the controller 3. The controller interface circuit 20 receives the data DQ and the strobe signal DQS transmitted from the controller 3 via the NAND bus 4, samples the data DQ by the strobe signal DQS, and then performs control to write the data DQ to the memory cell array 21. In accordance with a read request from the controller 3, the controller interface circuit 20 synchronizes the data DQ corresponding to data read from the memory cell array 21 with the strobe signal DQS and transmits the data DQ to the controller 3 via the NAND bus 4. The detailed internal configuration and operation of the controller interface circuit 20 will be described later.

The memory cell array 21 includes a plurality of blocks including a plurality of nonvolatile memory cells associated with rows and columns. Reading and writing of data from and to the memory cell array 21 is controlled by the sequencer 26.

The row decoder 22 selects one of a plurality of blocks, and further selects a row direction in the selected block. The driver circuit 23 supplies a voltage to the selected block via the row decoder 22.

When reading data, the column control circuit 24 senses data read from the memory cell array 21 and performs a necessary calculation. Then, the necessary calculated data is output to the controller 3 via the controller interface circuit 20. When writing data, the column control circuit 24 transfers a signal corresponding to data to be written received from the controller 3 to the memory cell array 21.

The register group 25 includes an address register, a command register, and the like. The address register stores the address received from the controller 3. The command register stores the command received from the controller 3.

The sequencer 26 controls the operations of the NAND memory 2 on the basis of the various types of information stored in the register group 25.

As described above, the NAND memory 2 and the controller 3 can transmit and receive the data DQ at high speed via the NAND bus 4. When writing data corresponding to the data DQ to be transmitted to the memory cell array 21 of the NAND memory 2, the controller 3 transmits address information specifying a memory cell to be written in the memory cell array 21 via the NAND bus 4. In addition, the controller 3 transmits data DQ to be written to the memory cell to be written and a strobe signal DQS synchronized with the data DQ to the NAND memory 2 via the NAND bus 4. When reading data stored in the memory cell array 21, the controller 3 transmits address information specifying a memory cell to be read in the memory cell array 21 to the NAND memory 2 via the NAND bus 4. The NAND memory 2 transmits data DQ corresponding to the data read based on the address information and a strobe signal DQS synchronized with the data DQ to the controller 3 via the NAND bus 4.

In this manner, the data DQ transmitted and received through the NAND bus 4 is synchronized with the strobe signal DQS, and both the data DQ and the strobe signal DQS are transmitted and received through the NAND bus 4. On the reception side, the received data DQ is sampled by the received strobe signal DQS, so that the data DQ can be synchronized between the transmission side and the reception side without separately transmitting and receiving a clock signal.

Figure 2:
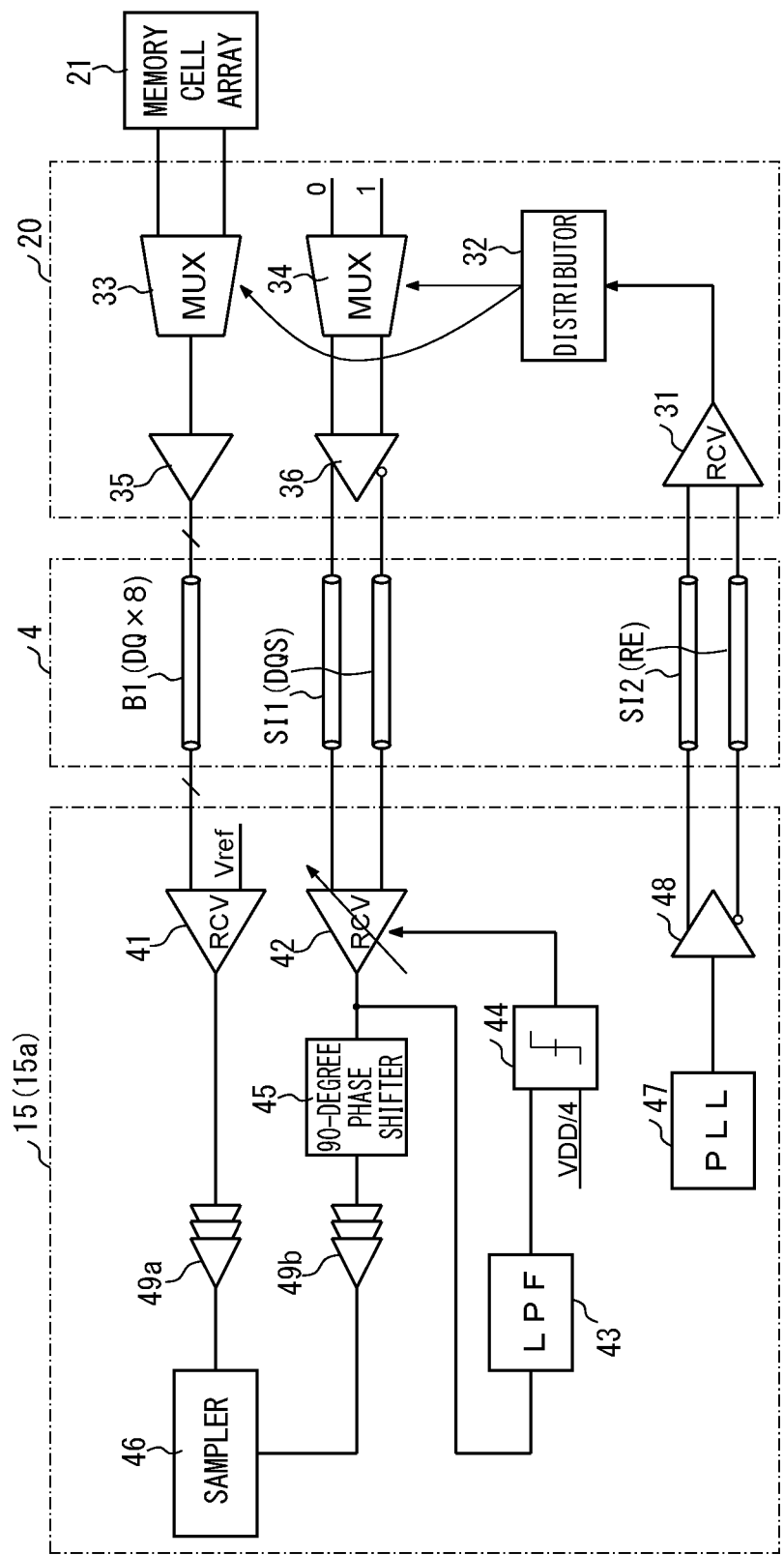
FIG. 2 is a block diagram illustrating a configuration related to data reading of a NAND interface circuit of a controller, a NAND bus, and a controller interface circuit of a NAND memory.

FIG. 2 is a block diagram illustrating a configuration related to data reading of the NAND interface circuit 15 of the controller 3, the NAND bus 4, and the controller interface circuit 20 of the NAND memory 2.

The NAND bus 4 includes a bus B1, two signal lines SI1, and two signal lines SI2. The bus B1 transmits and receives 8-bit data DQ in parallel. The two signal lines SI1 differentially transmit and receive the strobe signal DQS synchronized with the data DQ. The two signal lines SI2 differentially transmit and receive the reference signal RE used to generate the strobe signal DQS in the NAND memory 2.

At the time of data reading, 8-bit data DQ and a differential strobe signal DQS are transmitted from the NAND memory 2 to the controller 3 via the NAND bus 4. On the other hand, the differential reference signal RE is transmitted from the controller 3 to the NAND memory 2 via the NAND bus 4.

The controller interface circuit 20 of the NAND memory 2 includes a reference signal receiver 31 (RCV), a distributor 32, a DQ multiplexer (MUX) 33, a DQS multiplexer (MUX) 34, a DQ transmission buffer 35, and a DQS transmission buffer 36.

The reference signal receiver 31 receives the differential reference signal RE transmitted from the controller 3 via the NAND bus 4. The distributor 32 distributes the received reference signal RE to the DQ multiplexer 33 and the DQS multiplexer 34.

The DQ multiplexer 33 synchronizes the 8-bit data DQ read from the memory cell array 21 with the reference signal RE distributed by the distributor 32 and outputs the data DQ. The DQS multiplexer 34 generates a differential strobe signal DQS on the basis of the reference signal RE used by the DQ multiplexer 33 to synchronize the data DQ. A 0-level potential signal and a 1-level potential signal are input to the DQS multiplexer 34. The DQS multiplexer 34 selects and outputs one of the two input potential signals on the basis of the distributed reference signal RE, thereby generating the strobe signal DQS.

The DQ transmission buffer 35 performs equalization processing for adjusting the frequency characteristics of the 8-bit data DQ output from the DQ multiplexer 33, and transmits the 8-bit data DQ after the equalization processing to the NAND bus 4. The DQS transmission buffer 36 equalizes the differential strobe signal DQS output from the DQS multiplexer 34, and transmits the equalized differential strobe signal DQS to the NAND bus 4.

The transmission and reception circuit 15a of the NAND interface circuit 15 of the controller 3 includes a DQ receiver (RCV) 41, a DQS receiver (RCV) 42, a low-pass filter (LPF) 43, a comparator 44, a 90-degree phase shifter 45, a sampler 46, a PLL circuit 47, an output buffer 48, a buffer 49a, and a buffer 49b.

The DQ receiver 41 receives 8-bit data DQ transmitted from the NAND memory 2 via the NAND bus 4. The 8-bit data DQ is data DQ to be read. At this time, the DQ receiver 41 may perform processing of boosting the high-frequency component of the received data DQ to suppress the influence of ISI by the NAND bus 4.

The DQS receiver 42 has an equalizer function of varying the boost amount of the high-frequency component of the received strobe signal DQS on the basis of the comparison result by the comparator 44. The boost amount corresponds to a difference between the gain of the DC component and the peak gain of the AC component. As described above, unlike the DQ receiver 41, the DQS receiver 42 can vary the boost amount of the high-frequency component, and thus can reduce power consumption by reducing the boost amount when not necessary. For example, the DQS receiver 42 converts the differential strobe signal DQS into a single-phase strobe signal DQS and outputs the single-phase strobe signal DQS. Note that, the DQS receiver 42 may output the differential strobe signal DQS in a differential state.

The low-pass filter 43 extracts a low-frequency component including at least a DC component included in the strobe signal DQS output from the DQS receiver 42 and outputs a first signal.

The comparator 44 compares the signal level of the first signal with a threshold level. The threshold level is set to, for example, about ¼ of the power supply voltage VDD of the NAND interface circuit 15. The threshold level may be variably set to any signal level.

The comparator 44 transmits a comparison result signal indicating whether the signal level of the first signal is equal to or lower than the threshold level or higher than the threshold level to the DQS receiver 42. The DQS receiver 42 varies the boost amount of the high-frequency component different from the low-frequency component of the strobe signal DQS on the basis of the comparison result signal of the comparator 44. More specifically, the DQS receiver 42 adjusts the gain of the high-frequency component without changing the gain of the DC component of the strobe signal DQS on the basis of the comparison result signal. For example, the comparator 44 determines that the strobe signal DQS is absent when the signal level of the first signal is equal to or lower than the threshold level, and determines that the strobe signal DQS is present when the signal level of the first signal is higher than the threshold level.

The 90-degree phase shifter 45 shifts the phase of the output signal (that is, the strobe signal DQS) of the DQS receiver 42 by 90 degrees. By provision of the 90-degree phase shifter 45, a setup time and a hold time when the data DQ is sampled by the strobe signal DQS are secured.

The sampler 46 samples the data DQ output from the DQ receiver 41 on the basis of the strobe signal DQS output from the 90-degree phase shifter 45. The controller 3 handles the data DQ sampled by the sampler 46 as read data and performs processing such as transmission to the ECC circuit 16.

Note that the data DQ output from the DQ receiver 41 is input to the sampler 46 via the buffer 49a. Similarly, the strobe signal DQS output from the 90-degree phase shifter 45 is input to the sampler 46 via the buffer 49b. The buffers 49a and 49b may have a delay adjustment function in addition to the function of buffering the data DQ and the strobe signal DQS.

The PLL circuit 47 generates a clock signal corresponding to the reference signal RE of the strobe signal DQS. The PLL circuit 47 intermittently outputs a clock signal having a certain frequency in accordance with the operation in which the NAND memory 2 reads the data DQ from the memory cell array 21. The output buffer 48 buffers and outputs the clock signal output from the PLL circuit 47. The clock signal output from the output buffer 48 is transmitted as a differential reference signal RE to the NAND memory 2 via the NAND bus 4.

Figure 3:
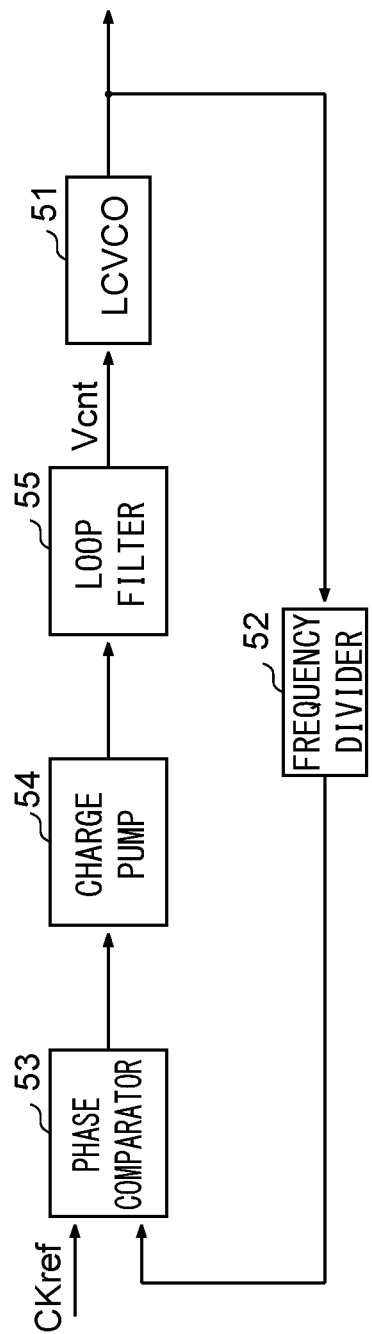
FIG. 3 is a block diagram illustrating an example of an internal configuration of a PLL circuit of FIG. 2.

FIG. 3 is a block diagram illustrating an example of an internal configuration of the PLL circuit 47 of FIG. 2. The PLL circuit 47 of FIG. 3 includes an LCVCO 51, a frequency divider 52, a phase comparator 53, a charge pump 54, and a loop filter 55.

The LCVCO 51 generates an oscillation signal having an oscillation frequency corresponding to a voltage level of the control voltage Vcnt output from the loop filter 55. The internal configuration of the LCVCO 51 will be described later.

The frequency divider 52 frequency-divides the oscillation signal to generate a frequency-divided signal with a reduced frequency. The phase comparator 53 compares a phases of the reference clock signal CKref and the frequency-divided signal and outputs a phase difference signal. The charge pump 54 generates a voltage signal corresponding to the phase difference signal. The loop filter 55 removes an unnecessary frequency component included in the voltage signal output from the charge pump 54 to generate the control voltage Vcnt. The LCVCO 51 is an example of a semiconductor integrated circuit.

Figure 4:
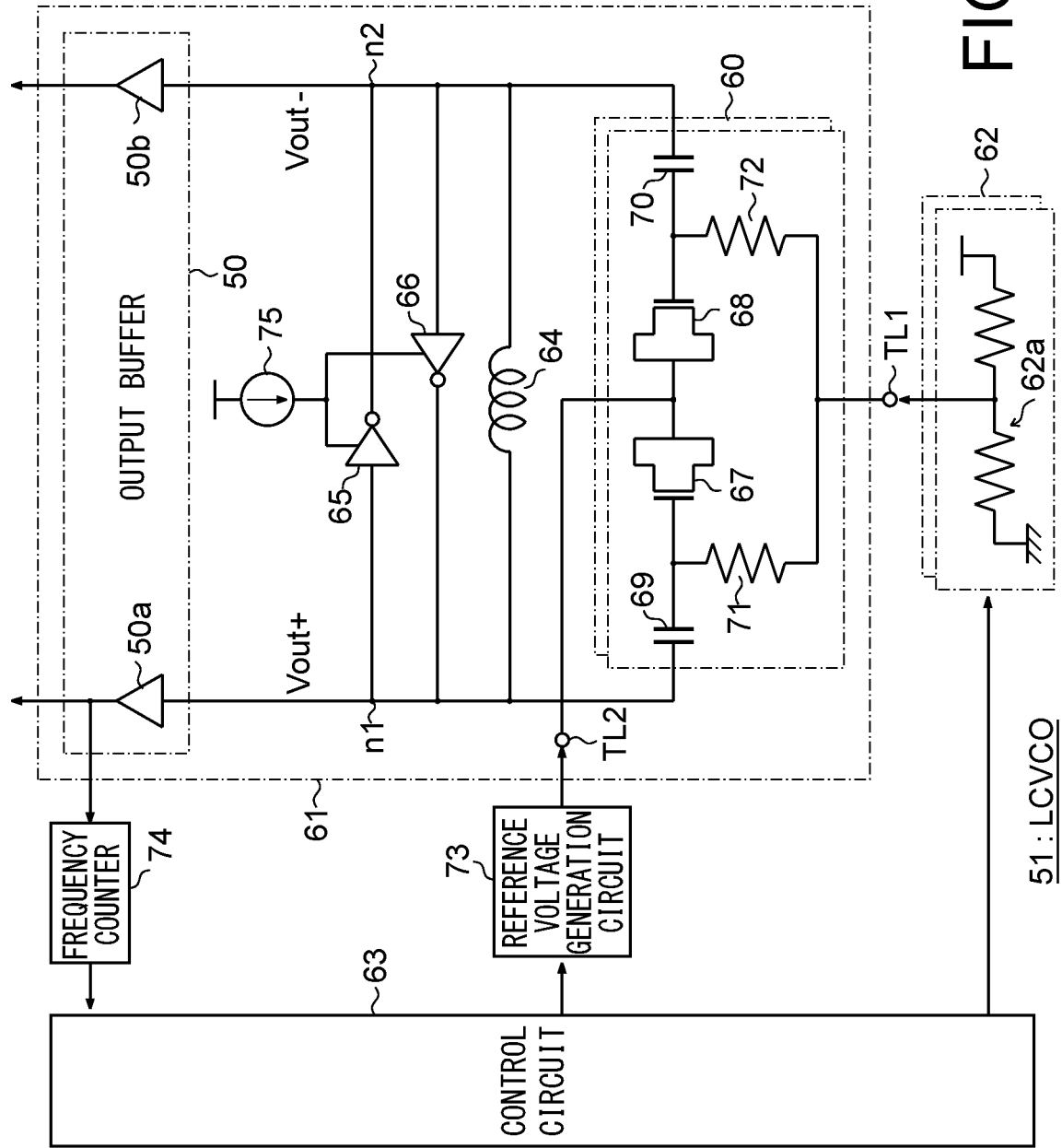
FIG. 4 is a circuit diagram of an LCVCO according to the present embodiment.

FIG. 4 is a circuit diagram of the LCVCO 51 according to the present embodiment. The LCVCO 51 according to the present embodiment includes an oscillation circuit 61, a bias circuit 62, a control circuit 63, a reference voltage generation circuit 73, and a frequency counter 74.

The oscillation circuit 61 includes a first output node n1 and a second output node n2, a plurality of capacitance circuits 60, an inductor 64, a first inverter 65, a second inverter 66, and an output buffer 50.

The oscillation circuit 61 complementarily outputs oscillation signals Vout+ and Vout− having an oscillation frequency corresponding to the voltage level of the control voltage Vcnt from the first output node n1 and the second output node n2. The complementary output means that oscillation signals having phases different from each other by 180 degrees are differentially output.

The plurality of capacitance circuits 60 are connected in parallel between the first output node n1 and the second output node n2. Each of the plurality of capacitance circuits 60 includes a first variable capacitance element 67 and a second variable capacitance element 68 connected in series between the first output node n1 and the second output node n2. The first variable capacitance element 67 and the second variable capacitance element 68 are also called varactors or varicaps, and can variably adjust the capacitance according to the bias voltage.

The first variable capacitance element 67 and the second variable capacitance element 68 can be formed using a metal oxide semiconductor (MOS) transistor, and capacitance can be variably adjusted by controlling a bias voltage input to a gate. The first variable capacitance element 67 and the second variable capacitance element 68 are arranged to face each other. In the present specification, a terminal for capacitance control of the first variable capacitance element 67 and the second variable capacitance element 68 is referred to as a capacitance control terminal TL1. Each of the capacitance control terminals TL1 serves as a gate when the first variable capacitance element 67 and the second variable capacitance element 68 are constituted by MOS transistors. Bias voltages of the same voltage level from the bias circuit 62 are input to these gates. As described above, each of the plurality of capacitance circuits 60 has the capacitance control terminal TL1 for variably adjusting the capacitance.

The bias circuit 62 supplies bias voltages of different voltage levels to each of the plurality of capacitance circuits 60. Specifically, the bias circuit 62 supplies a bias voltage different for each of the capacitance circuits 60 to the capacitance control terminal TL1 for the first variable capacitance element 67 and the second variable capacitance element 68 in each of the capacitance circuits 60.

The control circuit 63 controls the bias circuit 62 and supplies a reference voltage for controlling the oscillation frequency of the oscillation signal to the plurality of capacitance circuits 60. During the normal operation of the PLL circuit 47, the oscillation frequency of the oscillation signal output from the LCVCO 51 is controlled by the control voltage Vcnt output from the loop filter 55 in the PLL circuit 47. At this time, the control voltage Vcnt is input to the capacitance circuit 60 of the oscillation circuit 61. The control circuit 63 controls the output of the reference voltage generation circuit 73 to be high impedance so that the output of the reference voltage generation circuit 73 does not affect the control voltage Vcnt. On the other hand, at the time of calibration of the LCVCO 51 included in the PLL circuit 47, the operation of the PLL circuit 47 is stopped. At this time, the control circuit 63 supplies a reference voltage for calibration to the LCVCO 51 via the reference voltage generation circuit 73 to control the oscillation frequency of the oscillation signal. That is, the reference voltage generation circuit 73 generates a reference voltage for calibration. At the time of calibration, the control circuit 63 controls the control voltage Vcnt output from the loop filter 55 to be high impedance so that the output of the reference voltage generation circuit 73 is not affected by the control voltage Vcnt. In the present specification, the normal operation of the PLL circuit 47 may be referred to as a first mode, and the calibration operation of the LCVCO 51 in the PLL circuit 47 may be referred to as a second mode.

The control circuit 63 controls the bias voltage on the basis of a change in the oscillation frequency of the oscillation signal when the voltage level of the reference voltage supplied to the connection node of the first variable capacitance element 67 and the second variable capacitance element 68 is changed in a plurality of ways. In the present embodiment, the connection node of the first variable capacitance element 67 and the second variable capacitance element 68 is referred to as a frequency control terminal TL2. The control voltage Vcnt is input to the frequency control terminal TL2 during the normal operation of the LCVCO 51, and the reference voltage is input to the frequency control terminal TL2 during calibration. As described above, each of the plurality of capacitance circuits 60 has the frequency control terminal TL2 for variably adjusting the frequency of the oscillation signal.

The calibration of the LCVCO 51 may be forcibly performed when the LCVCO 51 is activated. Alternatively, it may be performed at an arbitrary timing according to an instruction from a user of the controller 3 including the NAND interface circuit 15. Alternatively, the LCVCO 51 may be calibrated by using a change in an environmental condition such as a temperature or a power supply voltage of the controller 3 including the NAND interface circuit 15 as a trigger.

The control circuit 63 may control calibration of the LCVCO 51 and stop most operations when the LCVCO 51 is operated normally. When the LCVCO 51 is operated normally, the bias circuit 62 outputs the bias voltage set based on the calibration result. In addition, the control voltage Vcnt output from the loop filter 55 in the PLL circuit 47 is supplied to the frequency control terminal TL2 of the LCVCO 51.

More specifically, each of the plurality of capacitance circuits 60 may include a first capacitance element 69 and a second capacitance element 70, and a first resistance element 71 and a second resistance element 72 in addition to the first and second variable capacitance elements 67 and 68.

The first capacitance element 69, the first variable capacitance element 67, the second variable capacitance element 68, and the second capacitance element 70 are connected in series between the first output node n1 and the second output node n2. The first capacitance element 69 is disposed between the first output node n1 and the first variable capacitance element 67. The second capacitance element 70 is disposed between the second output node n2 and the second variable capacitance element 68. The first resistance element 71 is connected between a connection node of the first capacitance element 69 and the first variable capacitance element 67 and an output node of the bias circuit 62 via the capacitance control terminal TL1. The second resistance element 72 is connected between a connection node of the second capacitance element 70 and the second variable capacitance element 68 and an output node of the bias circuit 62 via the capacitance control terminal TL1.

From the viewpoint of circuit symmetry of the LCVCO 51, it is desirable that the first capacitance element 69 and the second capacitance element 70 have the same capacitance value. Similarly, it is desirable that the first variable capacitance element 67 and the second variable capacitance element 68 have the same capacitance value. Similarly, it is desirable that the first resistance element 71 and the second resistance element 72 have the same resistance value.

The first inverter 65 and the second inverter 66 are provided to stabilize the oscillation operation of the oscillation circuit 61. The first inverter 65 and the second inverter 66 can be omitted, but if omitted, the oscillation operation may become unstable.

A current may be supplied from a current source 75 to the power supply terminals of the first inverter 65 and the second inverter 66. By provision of the current source 75, the oscillation circuit 61 can be made low in noise.

The reference voltage generation circuit 73 generates a plurality of reference voltages having different voltage levels. The control circuit 63 switches the reference voltage to be supplied to the plurality of capacitance circuits 60 using the reference voltage generation circuit 73. As described above, the reference voltage is input to the frequency control terminal TL2 of the LCVCO 51 instead of the control voltage Vcnt. In the LCVCO 51 of FIG. 4, the reference voltage generation circuit 73 may be provided inside the control circuit 63.

The output buffer 50 includes two output buffers 50a and 50b connected to the first output node n1 and the second output node n2 of the LCVCO 51, respectively. The oscillation signals buffered by the output buffers 50a and 50b are supplied to a subsequent circuit in a differential form. The oscillation signal output from one of the two output buffers 50a and 50b is input to the frequency counter 74. The frequency counter 74 outputs a frequency count number corresponding to the frequency of the oscillation signal. As described later, the control circuit 63 optimizes the bias voltage on the basis of the degree of change in the frequency count number with respect to the change in the voltage level of the reference voltage. The output buffer 50 of FIG. 4 may be provided outside the LCVCO 51. In the LCVCO 51 of FIG. 4, the frequency counter 74 may be provided inside the control circuit 63.

Figure 5:
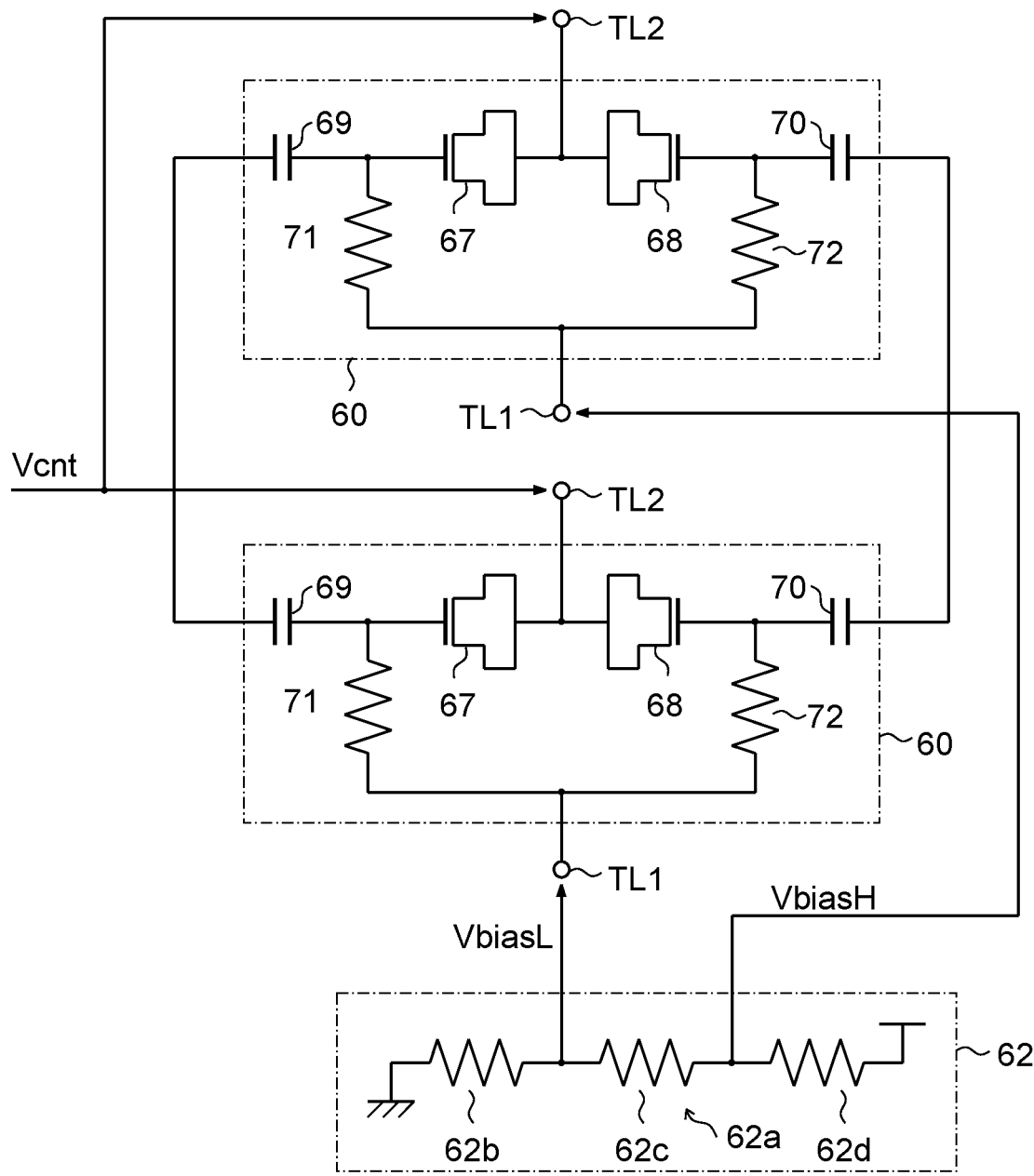
FIG. 5 is a diagram illustrating an example of a connection form between a plurality of capacitance circuits and a bias circuit in the LCVCO.

FIG. 5 is a diagram illustrating an example of a connection form between the plurality of capacitance circuits 60 and the bias circuit 62 in the LCVCO 51. FIG. 5 illustrates an example in which two capacitance circuits 60 are provided and a resistance voltage dividing circuit 62a is provided in the bias circuit 62. Although FIG. 4 illustrates an example in which the plurality of bias circuits 62 corresponding to the plurality of capacitance circuits 60 are provided, FIG. 5 illustrates an example in which the plurality of bias circuits 62 are integrated into one. The resistance voltage dividing circuit 62a in the bias circuit 62 of FIG. 5 includes, for example, three resistance elements 62b, 62c, and 62d connected in series, and outputs the resistance divided bias voltages VbiasH and VbiasL from between the two adjacent resistance elements. The three resistance elements 62b, 62c, and 62d are arranged between a certain potential and a ground potential.

Hereinafter, one (the upper side in FIG. 5) of the two capacitance circuits 60 in FIG. 5 is referred to as a first capacitance circuit 60, and the other (the lower side in FIG. 5) is referred to as a second capacitance circuit 60. The bias voltage VbiasH is supplied to one ends of the first resistance element 71 and the second resistance element 72 in the first capacitance circuit 60, and the bias voltage VbiasL is supplied to one ends of the first resistance element 71 and the second resistance element 72 in the second capacitance circuit 60.

The voltage levels of the bias voltages VbiasH and VbiasL output from the bias circuit 62 may fluctuate due to manufacturing variations and environmental conditions such as temperature. When the bias voltages VbiasH and VbiasL fluctuate, the capacitance values of the first variable capacitance element 67 and the second variable capacitance element 68 of each of the first capacitance circuit 60 and the second capacitance circuit 60 fluctuate.

Figure 6:
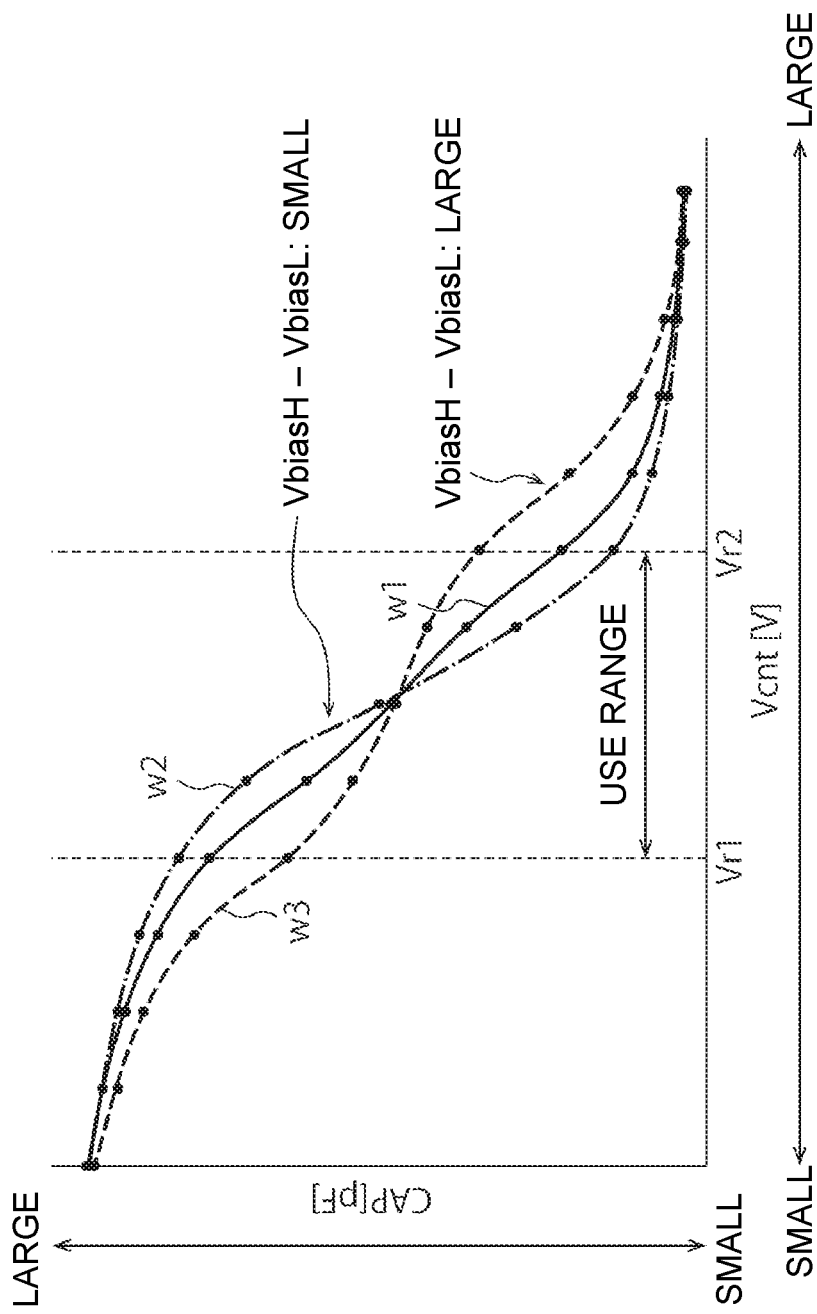
FIG. 6 is a diagram illustrating a relationship between a control voltage of the LCVCO and capacitance values of a first variable capacitance element and a second variable capacitance element.

FIG. 6 is a diagram illustrating a relationship between the control voltage Vcnt of the LCVCO 51 and the capacitance values of the first variable capacitance element 67 and the second variable capacitance element 68. The horizontal axis of FIG. 6 represents the voltage level of the control voltage Vcnt, and the vertical axis represents the capacitance values of the first variable capacitance element 67 and the second variable capacitance element 68. FIG. 6 illustrates three curves w1 to w3. The curve w1 indicates a case where the potential difference of VbiasH−VbiasL is an appropriate value, the curve w2 indicates a case where the potential difference of VbiasH−VbiasL is smaller than the appropriate value, and the curve w3 indicates a case where the potential difference of VbiasH−VbiasL is larger than the appropriate value. In FIG. 6, a range from the voltage level Vr1 to the voltage level Vr2 of the control voltage Vcnt is a use range for controlling the oscillation frequency of the LCVCO 51.

When the potential difference of VbiasH−VbiasL is an appropriate value as in the curve w1, the capacitance values of the first variable capacitance element 67 and the second variable capacitance element 68 uniformly change in a substantially linear manner having a substantially constant slope with respect to the change in the voltage level of the control voltage Vcnt within the use range of the control voltage Vcnt. In this case, even when the voltage level of the control voltage Vcnt is changed, a large change in the gain of the LCVCL does not occur. On the other hand, when the potential difference of VbiasH−VbiasL is not an appropriate value as in the curves w2 and w3, the capacitance values of the first variable capacitance element 67 and the second variable capacitance element 68 change in a non-linear manner in which the slope is not substantially constant with respect to the change in the voltage level of the control voltage Vcnt within the use range of the control voltage Vcnt. In this case, when the voltage level of the control voltage Vcnt is changed, the gain of LCVCL greatly fluctuates.

Therefore, in the present embodiment, the bias voltage is controlled (that is, calibrated) so that the gain of the LCVCO 51 does not vary even when the voltage level of the control voltage Vcnt changes.

Figure 7:
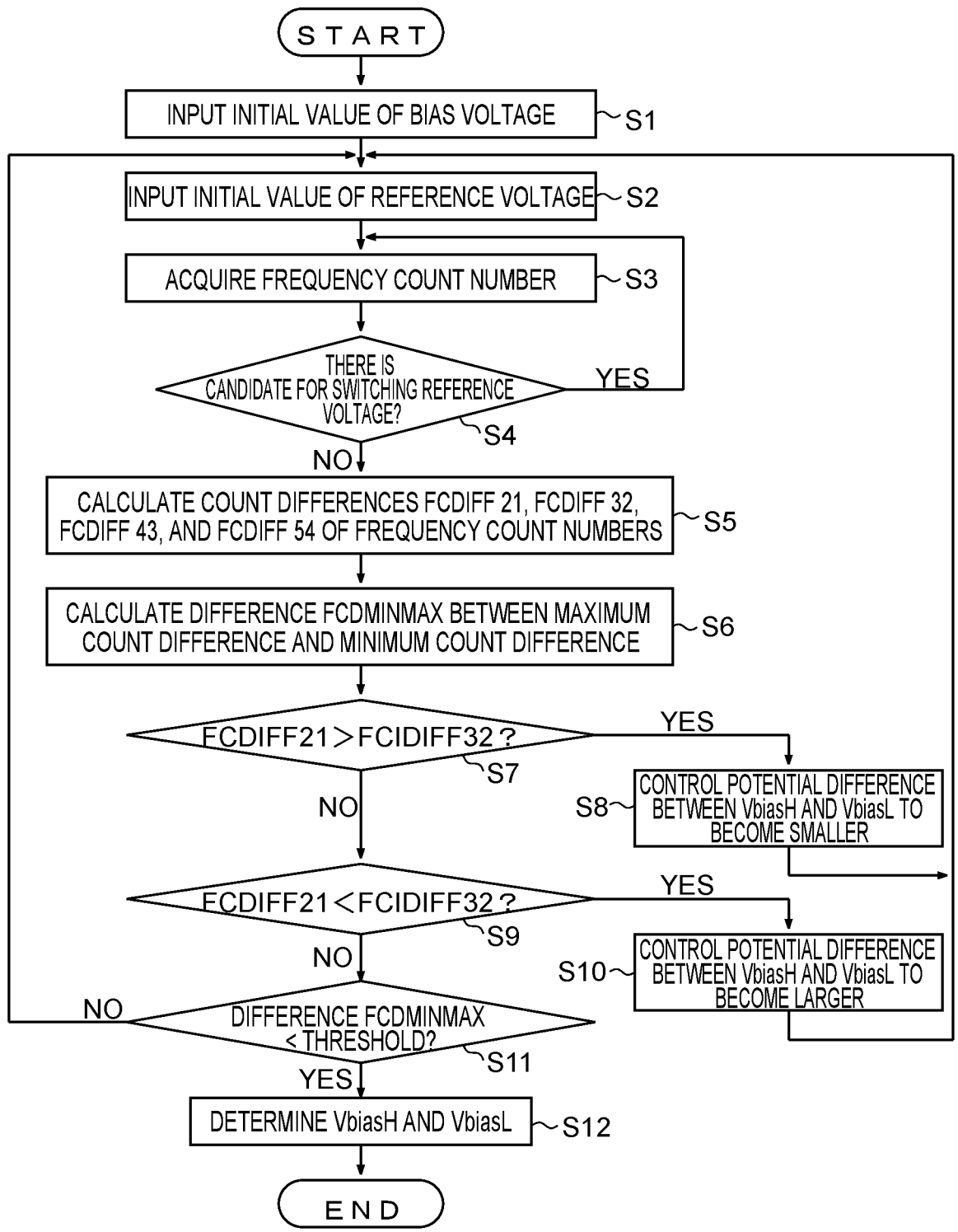
FIG. 7 is a flowchart illustrating a processing operation performed by a control circuit of the semiconductor integrated circuit according to the present embodiment.

FIG. 7 is a flowchart illustrating a processing operation performed by the control circuit 63 of the semiconductor integrated circuit according to the present embodiment. The control circuit 63 starts the operation of the flowchart of FIG. 7 when calibrating the semiconductor integrated circuit.

Figure 8:
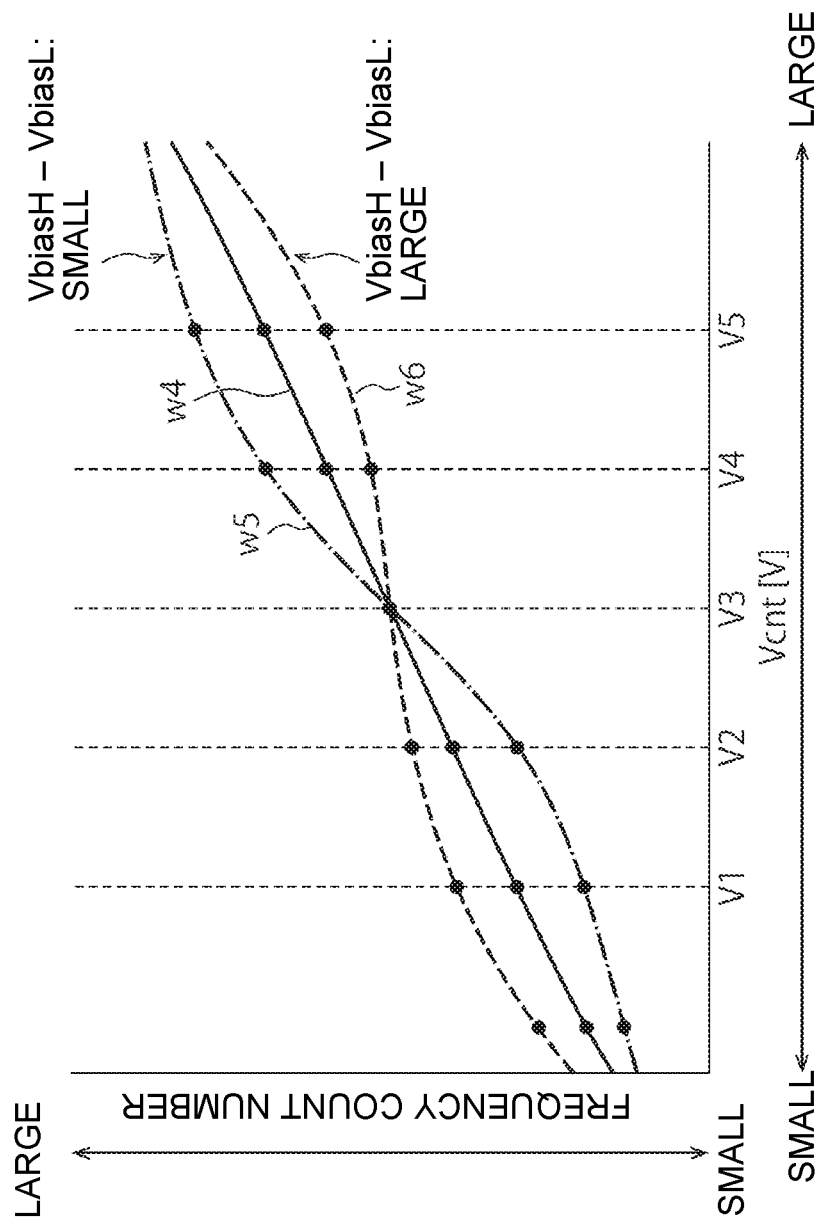
FIG. 8 is a diagram illustrating a relationship between a voltage level of a control voltage of the LCVCO and a frequency count number of an oscillation signal.

FIG. 8 is a diagram illustrating a relationship between the voltage level of the control voltage Vcnt of the LCVCO 51 and a frequency count number of the oscillation signal. The horizontal axis of FIG. 8 represents the voltage level of the control voltage Vcnt (reference voltage) input to the frequency control terminal TL2 of the LCVCO 51, and the vertical axis represents the frequency count number. A larger frequency count number means a higher frequency. FIG. 8 illustrates three curves w4, w5, and w6. The curve w4 indicates a case where the potential difference between the bias voltages VbiasH and VbiasL is an appropriate value, the curve w5 indicates a case where the potential difference is smaller than the appropriate value, and the curve w6 indicates a case where the potential difference is larger than the appropriate value. The voltages V1 to V5 in FIG. 8 are voltage levels within the use range of the control voltage Vcnt in the LCVCO 51.

Hereinafter, the operation of the LCVCO 51 at the time of calibration will be described based on the flowchart of FIG. 7 with reference to FIG. 8. First, the bias circuit 62 inputs initial values of the bias voltages VbiasH and VbiasL to the capacitance control terminal TL1 of each of the plurality of capacitance circuits 60 (S1). Next, the reference voltage generation circuit 73 inputs an initial value of the reference voltage to the frequency control terminal TL2 of the LCVCO 51 (S2).

Next, the frequency counter 74 acquires the frequency count number corresponding to the oscillation frequency of the oscillation signal of the LCVCO 51 (S3). Next, the control circuit 63 determines whether or not there is a candidate for switching the reference voltage (S4). In the present embodiment, as an example, the reference voltage generation circuit 73 sequentially generates reference voltages V1 to V5 of five types of voltage levels having different voltage levels. The five types of reference voltages V1 to V5 are shifted by the same potential difference, and all have voltage levels within the use range of the control voltage Vcnt.

When it is determined in S4 that there is a candidate for switching the reference voltage (YES in S4), the processing in S3 is performed again to acquire the frequency count number. When it is determined in S4 that there is no candidate for switching the reference voltage (NO in S4), the control circuit 63 calculates count differences FCDIFF 21, FCDIFF 32, FCDIFF 43, and FCDIFF 54 of two frequency count numbers corresponding to two reference voltages with adjacent voltage levels among five frequency count numbers FCOUNT1 to FCOUNT5 on the basis of the following equations (1) to (4) (S5).

$$FCOUNT2-FCOUNT1=FCDIFF21 \quad (1)$$

$$FCOUNT3-FCOUNT2=FCDIFF32 \quad (2)$$

$$FCOUNT4-FCOUNT3=FCDIFF43 \quad (3)$$

$$FCOUNT5-FCOUNT4=FCDIFF54 \quad (4)$$

Next, the control circuit 63 calculates a difference FCDMINMAX between the maximum count difference and the minimum count difference among the four count differences FCDIFF 21, FCDIFF 32, FCDIFF 43, and FCDIFF 54 (S6).

Next, the control circuit 63 determines whether or not the count difference satisfies FCDIFF 21>FCDIFF 32 (S7). In a case of YES in S7, the bias circuit 62 controls the potential difference between the bias voltages VbiasH and VbiasL to become smaller (S8). When the processing of S8 ends, the processing of S2 and subsequent steps are repeated.

As illustrated in FIG. 8, FCDIFF 21>FCDIFF 32 (YES in S7) is obtained in the case of the curve w6 in FIG. 8. In order to bring the curve w6 close to the ideal curve w4, the difference between the bias voltages VbiasH and VbiasL may be reduced to be brought close to an appropriate value.

In a case of NO in S7, it is determined whether or not FCDIFF 21<FCDIFF 32 is satisfied (S9). In a case of YES in S9, the bias circuit 62 controls the potential difference between the bias voltages VbiasH and VbiasL to become larger (S10). When the processing of S10 ends, the processing of S2 and subsequent steps are repeated.

As illustrated in FIG. 8, FCDIFF 21<FCDIFF 32 (YES in S9) is obtained in the case of the curve w5 in FIG. 8. In order to bring the curve w5 close to the ideal curve w4, the difference between the bias voltages VbiasH and VbiasL may be increased to be brought close to an appropriate value.

In a case of NO in S9, the control circuit 63 determines whether or not the difference FCDMINMAX calculated in S6 is less than a threshold. When the difference FCDMINMAX is equal to or larger than the threshold (NO in S11), the processing of S2 and subsequent steps are repeated. When the difference FCDMINMAX is less than the threshold (YES in S11), the control circuit 63 determines the last controlled bias voltages VbiasH and VbiasL as the final bias voltages (S12). As a result, the relationship between the voltage level of the control voltage Vcnt in FIG. 8 and the frequency count number of the oscillation signal can be approximated to the curve w4.

Figure 9:
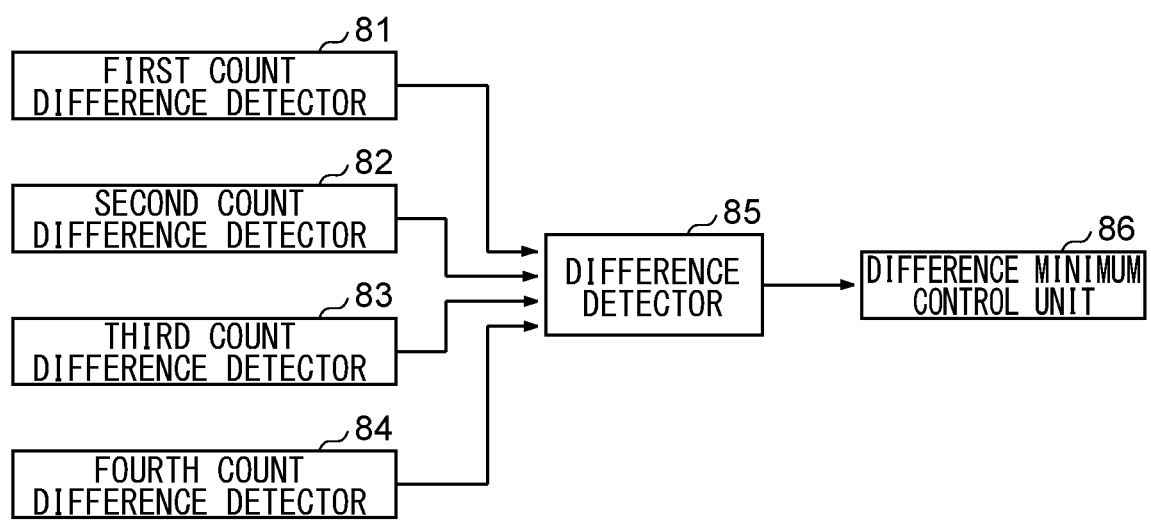
FIG. 9 is a block diagram functionally illustrating a processing operation of the control circuit.

FIG. 9 is a block diagram functionally illustrating a processing operation of the control circuit 63. The control circuit 63 may perform the processing operation of the flowchart of FIG. 7 by a central processing unit (CPU) reading and executing a program stored in a read only memory (ROM) or a random access memory (RAM), or the control circuit 63 may perform the processing operation of the flowchart of FIG. 7 by hardware corresponding to the block diagram of FIG. 9. The control circuit 63 of FIG. 9 illustrates a configuration in a case where the first capacitance circuit 60 and the second capacitance circuit 60 are provided as the capacitance circuit 60, a first bias voltage and a second bias voltage are provided as the bias voltages, and first to fifth reference voltages are provided as the reference voltages.

As illustrated in FIG. 9, the control circuit 63 includes a first count difference detector 81, a second count difference detector 82, a third count difference detector 83, a fourth count difference detector 84, a difference detector 85, and a difference minimum control unit 86.

The first count difference detector 81 detects a count difference between a second frequency count number and a first frequency count number. The second frequency count number is counted by the frequency counter 74 when the second reference voltage is supplied to the first capacitance circuit 60. The first frequency count number is counted by the frequency counter 74 when the first reference voltage is supplied to the first capacitance circuit 60.

The second count difference detector 82 detects a count difference between a third frequency count number and the second frequency count number. The third frequency count number is counted by the frequency counter 74 when the third reference voltage is supplied to the first capacitance circuit 60.

The third count difference detector 83 detects a count difference between a fourth frequency count number and the third frequency count number. The fourth frequency count number is counted by the frequency counter 74 when the fourth reference voltage is supplied to the first capacitance circuit 60.

The fourth count difference detector 84 detects a count difference between a fifth frequency count number and the fourth frequency count number. The fifth frequency count number is counted by the frequency counter 74 when the fifth reference voltage is supplied to the first capacitance circuit 60.

The control circuit 63 further decreases the potential difference between the first bias voltage and the second bias voltage when the count difference detected by the first count difference detector 81 is larger than the count difference detected by the second count difference detector 82, and further increases the potential difference between the first bias voltage and the second bias voltage when the count difference detected by the first count difference detector 81 is smaller than the count difference detected by the second count difference detector 82.

The difference detector 85 detects a difference between the maximum value and the minimum value among the count differences detected by the first to fourth count difference detectors 81 to 84. The difference minimum control unit 86 controls the final bias voltage so that the difference detected by the difference detector 85 is less than a threshold.

As described above, the LCVCO 51 according to the present embodiment can be applied to, for example, the transmission and reception circuit 15a provided in the NAND interface circuit 15 in the memory system 1 of FIG. 1. In general, a ring-type VCO having a wide frequency band is often used in the PLL circuit in the reception circuit 90 provided in the host I/F 11 in the memory system 1, but in some cases, the LCVCO 51 according to the present embodiment may be applied to the PLL circuit in the reception circuit.

Figure 10:
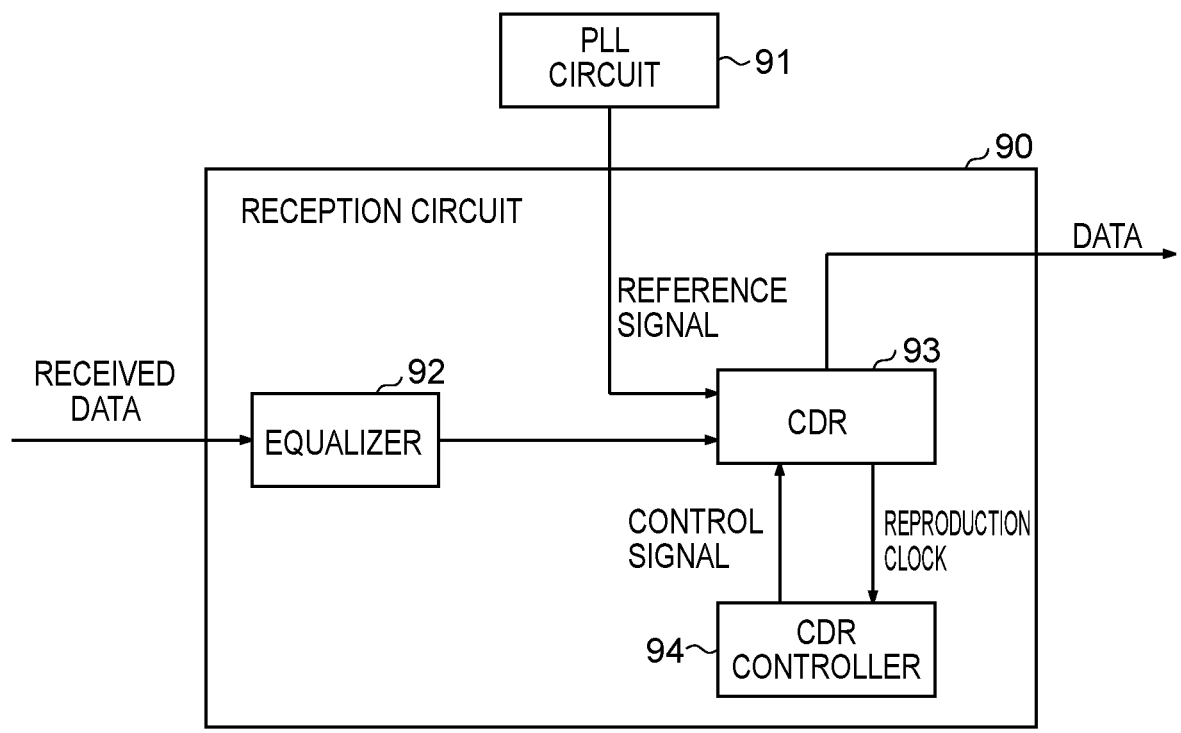
FIG. 10 is a block diagram illustrating an example of a specific configuration of a reception circuit.

FIG. 10 is a block diagram illustrating an example of a specific configuration of the reception circuit 90. The reception circuit 90 receives data transmitted from the host apparatus 6 as received data. The reception circuit 90 receives a reference signal from a PLL circuit 91. The reference signal is a clock signal of a certain frequency. The reception circuit 90 executes processing of extracting data included in the received data and outputs the extracted data to a subsequent circuit. The reception circuit 90 includes an equalizer 92, a CDR circuit 93, and a CDR circuit controller 94. The equalizer 92 shapes the waveform of the received data and outputs the waveform-shaped data to the CDR circuit 93.

The CDR circuit 93 reproduces a clock for extracting data from the received data on the basis of the received data. This clock is referred to as a reproduction clock. The CDR circuit 93 outputs the reproduction clock to the CDR circuit controller 94. The CDR circuit controller 94 generates various control signals and the like for controlling the CDR circuit 93 on the basis of the reproduction clock and outputs the generated control signals to the CDR circuit 93. The CDR circuit 93 receives the reference signal from the PLL circuit 91. As described above, the PLL circuit 91 can have a configuration similar to that of FIG. 3.

As described above, in the present embodiment, the bias voltage applied to the LCVCO 51 is controlled so that the gain of the LCVCO 51 does not fluctuate when the voltage level of the control voltage Vcnt of the LCVCO 51 is changed. More specifically, at the time of calibration of the LCVCO 51, instead of stopping the PLL control of the LCVCO 51 and inputting the control voltage Vcnt output from the loop filter 55 in the PLL circuit 47 to the frequency control terminal TL2 of the LCVCO 51, a plurality of reference voltages having different voltage levels are sequentially input to the frequency control terminal TL2, and the count differences of the frequency count numbers corresponding to the oscillation frequencies of the oscillation signal are compared. Differences between count differences of two frequency count numbers corresponding to two adjacent reference voltages are compared, and the bias voltage is controlled so that the frequency count number changes substantially linearly with respect to a change in a voltage level of the reference voltage. As a result, even when the voltage level of the control voltage Vcnt is changed, gain fluctuation of the LCVCO 51 can be suppressed.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor integrated circuit comprising:
    a first output node and a second output node configured to complementarily output an oscillation signal;
    a capacitance circuit connected between the first output node and the second output node;
    an inductor connected between the first output node and the second output node;
    a first inverter and a second inverter connected in parallel and in opposite directions to each other between the first output node and the second output node;
    a bias circuit configured to supply a bias voltage to the capacitance circuit;
    a control circuit configured to control the bias circuit and to supply a reference voltage for controlling an oscillation frequency of the oscillation signal to the capacitance circuit; and
    a counter configured to generate a count number corresponding to an oscillation frequency of the oscillation signal, wherein
    the capacitance circuit includes a first variable capacitance element and a second variable capacitance element connected in series between the first output node and the second output node, the control circuit is configured to control the bias voltage on a basis of a change in an oscillation frequency of the oscillation signal when a voltage level of the reference voltage supplied to a connection node of the first variable capacitance element and the second variable capacitance element is changed in a plurality of ways, and the reference voltage switch-controlled by the control circuit includes a first reference voltage, a second reference voltage, and a third reference voltage in ascending order of voltage levels, the control circuit comprises:

a first count difference detector configured to detect a count difference between a first frequency count number and a second frequency count number, the first frequency count number being counted by the counter when the first reference voltage is supplied to the capacitance circuit, the second frequency count number being counted by the counter when the second reference voltage is supplied to the capacitance circuit; and a second count difference detector configured to detect a count difference between the second frequency count number and a third frequency count number that is counted by the counter when the third reference voltage is supplied to the capacitance circuit, and the bias circuit is configured to control the bias voltage on a basis of the count difference detected by the first count difference detector and the count difference detected by the second count difference detector.

2. The semiconductor integrated circuit according to claim 1, wherein the control circuit is configured to control the bias voltage so that an oscillation frequency of the oscillation signal changes more linearly in response to changing the voltage level of the reference voltage supplied to the connection node of the first variable capacitance element and the second variable capacitance element in a plurality of ways.

3. The semiconductor integrated circuit according to claim 1, wherein the capacitance circuit further comprises:

a first capacitance element connected between the first output node and the first variable capacitance element; and a second capacitance element connected between the second output node and the second variable capacitance element, and the bias circuit is configured to supply the bias voltage at the same voltage level to a connection node of the first capacitance element and the first variable capacitance element and to a connection node of the second capacitance element and the second variable capacitance element.

4. The semiconductor integrated circuit according to claim 3, wherein the capacitance circuit further comprises:

a first resistance element connected between the connection node of the first capacitance element and the first variable capacitance element and an output node of the bias circuit; and a second resistance element connected between the connection node of the second capacitance element and the second variable capacitance element and the output node of the bias circuit, and the bias circuit is configured to supply the bias voltage to the connection node of the first capacitance element and the first variable capacitance element via the first resistance element, and to supply the bias voltage to the connection node of the second capacitance element and the second variable capacitance element via the second resistance element.

5. The semiconductor integrated circuit according to claim 1, further comprising a plurality of the capacitance circuits, wherein the bias circuit is configured to supply the bias voltages of different voltage levels to the plurality of capacitance circuits.

6. The semiconductor integrated circuit according to claim 5, wherein a first bias voltage and a second bias voltage are supplied to the plurality of capacitance circuits, and the control circuit is further configured to decrease a potential difference between the first bias voltage and the second bias voltage when the count difference detected by the first count difference detector is larger than the count difference detected by the second count difference detector, and is further configured to increase the potential difference between the first bias voltage and the second bias voltage when the count difference detected by the first count difference detector is smaller than the count difference detected by the second count difference detector.

7. The semiconductor integrated circuit according to claim 5, wherein the plurality of capacitance circuits include a first capacitance circuit to which a first bias voltage is supplied and a second capacitance circuit to which a second bias voltage is supplied, the reference voltage switch-controlled by the control circuit includes the first reference voltage, the second reference voltage, the third reference voltage, a fourth reference voltage, and a fifth reference voltage in ascending order of voltage levels, and the control circuit comprises:

a third count difference detector configured to detect a count difference between the third frequency count number and a fourth frequency count number that is counted by the counter when the fourth reference voltage is supplied to the first capacitance circuit;

a fourth count difference detector configured to detect a count difference between the fourth frequency count number and a fifth frequency count number that is counted by the counter when the fifth reference voltage is supplied to the first capacitance circuit;

a difference detector configured to detect a difference between a maximum value and a minimum value among the count differences detected by the first, second, third, and fourth count difference detectors; and a difference minimum control unit configured to control the bias voltage so that the difference is minimized.

8. The semiconductor integrated circuit according to claim 1, further comprising:

a first buffer connected to the first output node; and a second buffer connected to the second output node, wherein the oscillation signal output from the first buffer or the second buffer is input to the counter.

9. The semiconductor integrated circuit according to claim 1, further comprising a current source connected to a power supply terminal of the first inverter and a power supply terminal of the second inverter.

10. A transmission circuit comprising:
a semiconductor integrated circuit configured to complementarily output an oscillation signal;
a phase locked loop (PLL) circuit configured to perform PLL control on the oscillation signal output from the semiconductor integrated circuit; and
a buffer configured to buffer and output the oscillation signal on which the PLL control has been performed, wherein
the semiconductor integrated circuit comprises:
a first output node and a second output node configured to complementarily output the oscillation signal;
a capacitance circuit connected between the first output node and the second output node;
an inductor connected between the first output node and the second output node;
a first inverter and a second inverter connected in parallel and in opposite directions to each other between the first output node and the second output node;
a bias circuit configured to supply a bias voltage to the capacitance circuit;
a control circuit configured to control the bias circuit and to supply a reference voltage for controlling an oscillation frequency of the oscillation signal to the capacitance circuit; and
a counter configured to generate a count number corresponding to an oscillation frequency of the oscillation signal, wherein
the capacitance circuit comprises:
a first variable capacitance element and a second variable capacitance element connected in series between the first output node and the second output node; and
a control terminal to which the reference voltage is supplied, wherein
the control circuit is configured to control the bias voltage on a basis of a change in an oscillation frequency of the oscillation signal when a voltage level of the reference voltage supplied to a connection node of the first variable capacitance element and the second variable capacitance element is changed in a plurality of ways, and
the control terminal is supplied with a control voltage generated by the PLL control when a first mode for operating the PLL circuit is selected, and the PLL control is stopped and the control terminal is supplied with the reference voltage when a second mode for controlling the bias voltage is selected, and
the reference voltage switch-controlled by the control circuit includes a first reference voltage, a second reference voltage, and a third reference voltage in ascending order of voltage levels,
the control circuit comprises:
a first count difference detector configured to detect a count difference between a first frequency count number and a second frequency count number, the first frequency count number being counted by the counter when the first reference voltage is supplied to the capacitance circuit, the second frequency count number being counted by the counter when the second reference voltage is supplied to the capacitance circuit; and
a second count difference detector configured to detect a count difference between the second frequency count number and a third frequency count number that is counted by the counter when the third reference voltage is supplied to the capacitance circuit, and
the bias circuit is configured to control the bias voltage on a basis of the count difference detected by the first count difference detector and the count difference detected by the second count difference detector.

11. The transmission circuit according to claim 10, wherein
the PLL circuit comprises:
a frequency divider configured to divide a frequency of the oscillation signal;
a phase comparator configured to generate a phase difference signal between a reference signal and a signal frequency-divided by the frequency divider;
a charge pump configured to generate a voltage signal corresponding to the phase difference signal; and
a loop filter configured to remove an unnecessary frequency component included in the voltage signal, and wherein
when the first mode is selected, an output signal of the loop filter is supplied to the control terminal, and
when the second mode is selected, the output of the loop filter becomes high impedance.

12. The transmission circuit according to claim 10, wherein
the control circuit is configured to control the bias voltage so that an oscillation frequency of the oscillation signal changes more linearly in response to changing the voltage level of the reference voltage supplied to the connection node of the first variable capacitance element and the second variable capacitance element in a plurality of ways.

13. The transmission circuit according to claim 10, wherein
the capacitance circuit further comprises:
a first capacitance element connected between the first output node and the first variable capacitance element; and
a second capacitance element connected between the second output node and the second variable capacitance element, and
the bias circuit is configured to supply the bias voltage at the same voltage level to a connection node of the first capacitance element and the first variable capacitance element and to a connection node of the second capacitance element and the second variable capacitance element.

14. The transmission circuit according to claim 13, wherein
the capacitance circuit further comprises:
a first resistance element connected between the connection node of the first capacitance element and the first variable capacitance element and an output node of the bias circuit; and
a second resistance element connected between the connection node of the second capacitance element and the second variable capacitance element and the output node of the bias circuit, and
the bias circuit is configured to supply the bias voltage to the connection node of the first capacitance element and the first variable capacitance element via the first resistance element, and to supply the bias voltage to the connection node of the second capacitance element and the second variable capacitance element via the second resistance element.

15. The transmission circuit according to claim 10, further comprising
a current source connected between a power supply terminal of the first inverter and a power supply terminal of the second inverter.

16. A calibration method for a voltage controlled oscillator, the voltage controlled oscillator comprising:
- a first output node and a second output node configured to complementarily output an oscillation signal;
- a capacitance circuit and an inductor connected in parallel between the first output node and the second output node; and
- a bias circuit configured to supply a bias voltage to the capacitance circuit, wherein
- the capacitance circuit includes a first variable capacitance element and a second variable capacitance element connected in series between the first output node and the second output node, and
- an oscillation frequency of the oscillation signal is controlled in accordance with a reference voltage, and
- the calibration method comprising:
- changing a voltage level of the reference voltage supplied to a connection node of the first variable capacitance element and the second variable capacitance element in a plurality of ways;
- controlling the bias voltage on a basis of a change in an oscillation frequency of the oscillation signal when a voltage level of the reference voltage is changed in a plurality of ways, the reference voltage including a first reference voltage, a second reference voltage, and a third reference voltage in ascending order of voltage levels;
- detecting a count difference between a first frequency count number and a second frequency count number, the first frequency count number being counted when the first reference voltage is supplied to the capacitance circuit, the second frequency count number being counted when the second reference voltage is supplied to the capacitance circuit;
- detecting a count difference between the second frequency count number and a third frequency count number that is counted when the third reference voltage is supplied to the capacitance circuit; and
- controlling the bias voltage on a basis of the count difference between the first frequency count number and the second frequency count number, and the count difference between the second frequency count number and the third frequency count number.

17. The calibration method according to claim 16, further comprising
controlling the bias voltage so that an oscillation frequency of the oscillation signal changes more linearly in response to changing the voltage level of the reference voltage supplied to the connection node of the first variable capacitance element and the second variable capacitance element in a plurality of ways.

18. The calibration method according to claim 16, wherein
the capacitance circuit further comprises:
- a first capacitance element connected between the first output node and the first variable capacitance element; and
- a second capacitance element connected between the second output node and the second variable capacitance element, wherein
the calibration method further comprising:
supplying the bias voltage at the same voltage level to a connection node of the first capacitance element and the first variable capacitance element and to a connection node of the second capacitance element and the second variable capacitance element.

19. The calibration method according to claim 18, wherein
the capacitance circuit further comprises:
- a first resistance element connected between the connection node of the first capacitance element and the first variable capacitance element and an output node of the bias circuit; and
- a second resistance element connected between the connection node of the second capacitance element and the second variable capacitance element and the output node of the bias circuit, wherein
the calibration method further comprising:
supplying the bias voltage to the connection node of the first capacitance element and the first variable capacitance element via the first resistance element, and to supply the bias voltage to the connection node of the second capacitance element and the second variable capacitance element via the second resistance element.

20. The calibration method according to claim 16, wherein
a current source is connected to a power supply terminal of the first inverter and a power supply terminal of the second inverter.

* * * * *